US011170152B2

(12) United States Patent
Chen et al.

(10) Patent No.: US 11,170,152 B2
(45) Date of Patent: Nov. 9, 2021

(54) INTEGRATED CIRCUIT AND LAYOUT METHOD FOR STANDARD CELL STRUCTURES

(71) Applicant: Taiwan Semiconductor Manufacturing Co., Ltd., Hsinchu (TW)

(72) Inventors: Sheng-Hsiung Chen, Zhubei (TW); Chung-Te Lin, Tainan (TW); Fong-Yuan Chang, Hsinchu County (TW); Ho Che Yu, Zhubei (TW); Li-Chun Tien, Tainan (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 16/912,229

(22) Filed: Jun. 25, 2020

(65) Prior Publication Data

US 2020/0327274 A1 Oct. 15, 2020

Related U.S. Application Data

(63) Continuation of application No. 15/965,358, filed on Apr. 27, 2018, now Pat. No. 10,733,352.
(Continued)

(51) Int. Cl.
*G06F 7/50* (2006.01)
*G06F 30/398* (2020.01)
(Continued)

(52) U.S. Cl.
CPC .......... *G06F 30/398* (2020.01); *G06F 30/394* (2020.01); *H01L 27/0207* (2013.01);
(Continued)

(58) Field of Classification Search
USPC ................................ 716/119, 120, 126, 127
See application file for complete search history.

(56) References Cited

U.S. PATENT DOCUMENTS 6,570,195 B2 * 5/2003 Brunolli ................ H01L 27/118
257/207
7,134,102 B2 11/2006 Poechmueller
(Continued)

FOREIGN PATENT DOCUMENTS

JP 2014236116 A 12/2014
KR 20160011562 A 2/2016
(Continued)

*Primary Examiner* — Brian Ngo
(74) *Attorney, Agent, or Firm* — Sterne, Kessler, Goldstein & Fox P.L.L.C.

(57) ABSTRACT

Placement methods described in this disclosure provide placement and routing rules where a system implementing the automatic placement and routing (APR) method arranges standard cell structures in a vertical direction that is perpendicular to the fins but parallel to the cell height. Layout methods described in this disclosure also improve device density and further reduce cell height by incorporating vertical power supply lines into standard cell structures. Pin connections can be used to electrically connect the power supply lines to standard cell structures, thus improving device density and performance. The APR process is also configured to rotate standard cells to optimize device layout.

20 Claims, 12 Drawing Sheets

Related U.S. Application Data

(60) Provisional application No. 62/589,470, filed on Nov. 21, 2017.

(51) Int. Cl.
  H01L 27/02 (2006.01)
  H01L 27/118 (2006.01)
  G06F 30/394 (2020.01)

(52) U.S. Cl.
  CPC .............. H01L 27/11807 (2013.01); *H01L 2027/11881* (2013.01)

(56) References Cited

U.S. PATENT DOCUMENTS

| | | |
|---|---|---|
| 9,886,544 B2 | 2/2018 | Hsieh et al. |
| 10,157,840 B2 | 12/2018 | Chen et al. |
| 10,242,148 B2 | 3/2019 | Weng |
| 2004/0089881 A1 | 5/2004 | Ono |
| 2005/0044522 A1 | 2/2005 | Maeda |
| 2008/0111158 A1 | 5/2008 | Sherlekar et al. |
| 2009/0113370 A1 | 4/2009 | Yoshinaga |
| 2011/0049575 A1 | 3/2011 | Tanaka |
| 2012/0299065 A1* | 11/2012 | Shimizu .............. H01L 27/0207 257/211 |
| 2012/0306101 A1* | 12/2012 | Tamaru ............. H01L 27/11898 257/774 |
| 2016/0300851 A1* | 10/2016 | Kim .................... H01L 27/0207 |
| 2017/0352650 A1* | 12/2017 | Azmat ............. H01L 27/11807 |
| 2018/0096981 A1* | 4/2018 | Chiu ....................... G06F 30/39 |
| 2018/0114755 A1* | 4/2018 | Kirimura ........... H01L 23/5226 |
| 2018/0301447 A1* | 10/2018 | Zhu .................... H01L 29/0696 |
| 2019/0131239 A1* | 5/2019 | Kirimura ............ H01L 23/5286 |
| 2019/0148407 A1* | 5/2019 | Guo ................... H01L 27/0924 257/206 |

FOREIGN PATENT DOCUMENTS

| | | |
|---|---|---|
| TW | 200511476 A | 3/2005 |
| TW | 201608404 A | 3/2016 |
| TW | 201730795 A | 9/2017 |
| WO | WO-2016209224 A1 | 12/2016 |

* cited by examiner

INTEGRATED CIRCUIT AND LAYOUT METHOD FOR STANDARD CELL STRUCTURES

CROSS-REFERENCE TO RELATED APPLICATION

This application is a continuation of U.S. Non-provisional patent application Ser. No. 15/965,358, titled "Integrated Circuit and Layout Method for Standard Cell Structures," which was filed on Apr. 27, 2018, which claims the benefit of U.S. Provisional Patent Application No. 62/589,470, titled "Integrated Circuit and Layout Method for Standard Cell Structures," which was filed on Nov. 21, 2017, all of which are incorporated herein by reference in their entireties.

BACKGROUND

The semiconductor integrated circuit (IC) industry has experienced exponential growth. In semiconductor IC design, standard cell methodologies are commonly used for the design of semiconductor devices on a chip. Standard cell methodologies use standard cells as abstract representations of certain functions to integrate millions devices on a single chip. As ICs continue to scale down, more and more devices are integrated into the single chip. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the common practice in the industry, various features are not drawn to scale. In fact, the dimensions of the various features may be arbitrarily increased or reduced for clarity of illustration and discussion.

DETAILED DESCRIPTION

Figure 1:
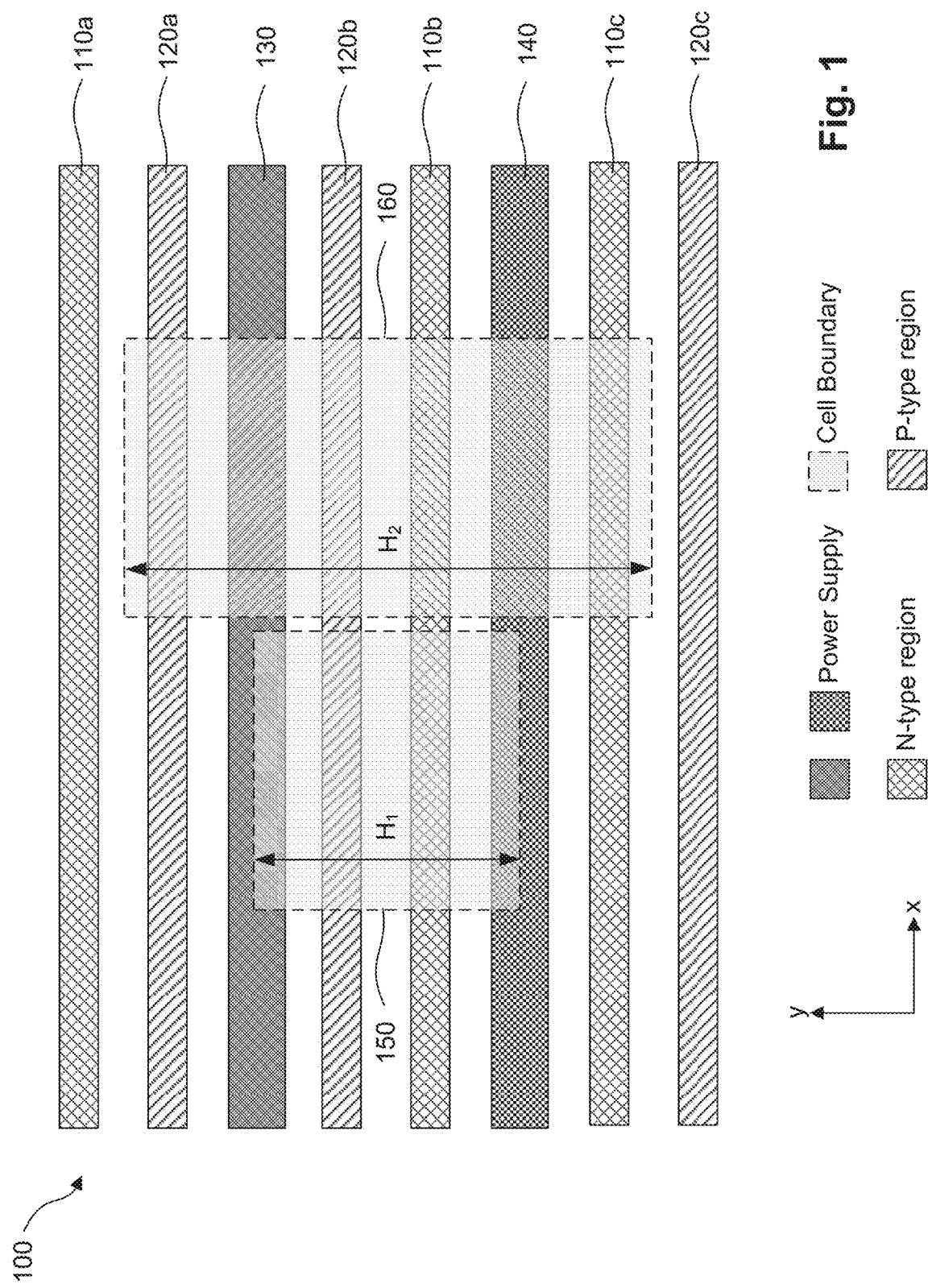
FIG. 1 is an illustration of an exemplary standard cell layout view that incorporate one-fin standard cell layout designs and two-fin standard cell layout designs, according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed between the first and second features, such that the first and second features may not be in direct contact. As used herein, the formation of a first feature on a second feature means the first feature is formed in direct contact with the second feature.

Spatially relative terms, such as "beneath," "below," "lower," "above," "upper," and the like may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It is noted that references in the specification to "one embodiment," "an embodiment," "an example embodiment," "exemplary," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of one skilled in the art to effect such feature, structure or characteristic in connection with other embodiments whether or not explicitly described.

It is to be understood that the phraseology or terminology herein is for the purpose of description and not of limitation, such that the terminology or phraseology of the present specification is to be interpreted by those skilled in relevant art(s) in light of the teachings herein.

As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10', ±20%, or ±30% of the value).

As used herein, the term "substantially" indicates that the value of a given quantity varies by ±1% to ±5% of the value.

As used herein, the term "substrate" describes a material onto which subsequent material layers are added. The substrate itself may be patterned. Materials added on top of the substrate may be patterned or may remain unpatterned. Furthermore, the substrate may be a wide array of semiconductor materials such as, for example, silicon, germanium, gallium arsenide, indium phosphide, etc. Alternatively, the substrate may be made from an electrically non-conductive material such as, for example, a glass or a sapphire wafer.

As used herein, the term "p-type" defines a structure, layer, and/or region as being doped with p-type dopants, such as, for example, boron.

As used herein, the term "n-type" defines a structure, layer, and/or region as being doped with n-type dopants, such as, for example, phosphorus.

As used herein, the term "critical dimension" refers to the smallest feature size (e.g., line width) of a finFET and/or an element of an integrated circuit.

Standard cell structures can incorporate transistor devices such as fin field-effect transistors (finFETs). In some embodiments, the standard cell structures can implement a one-fin layout which includes one p-type finFET and one n-type finFET. Compared to a two-fin layout which includes two p-type finFETs and two n-type finFETs, a one-fin layout is a more compact unit that provides improved layout flexibility and greater cell density. Standard cell structures usually have the same widths that are measured in the horizontal direction (e.g., parallel to fins) but have different heights that are measured in the vertical direction (e.g., perpendicular to fins), depending on the number of fins included. Although two-fin standard cell structures provide greater electrical drive capability and are used in standard cell structures where sufficient electrical drive is needed, using both one-fin and two-fin standard cell structures can be challenging because they have different cell heights that can lead to wasted space between adjacent standard cell structures. Different cell heights can cause difficulties for the automatic placement and routing (APR) tools to compact cells, shift cells, and utilize half-row empty spaces. For example, placement and routing methods usually use a horizontal row placement rule which arranges standard cell structures by shifting them in a horizontal direction (e.g., in a direction parallel to the fins of finFETs but perpendicular to cell height). However, because cell height differences are in a vertical direction that is perpendicular to the horizontal direction, the horizontal row placement rule can create wasted space between adjacent standard cell structures. Standard cell structures also require electrical power supply connections, and when used in combination with mixed cell heights the placement and routing process for APR can be further challenging.

Novel placement and routing methods described in this disclosure provide placement and routing rules where the APR tool arranges standard cell structures in a vertical direction that is perpendicular to the fins but parallel to the cell height. The vertical placement and routing rule enables the APR tool to arrange the standard cell structures in a vertical direction based at least on the cell heights of each standard cell structure. For example, a one-fin standard cell structure may have a half-row gap between itself and an adjacent two-fin standard cell structure. The APR tool can shift one of the standard cell structures up or down in the vertical direction rather than the horizontal direction to remove the half-row gap while preserving functionalities and connections of the standard cell structures.

Novel layout methods described in this disclosure also improves device density and further reduces cell height by incorporating vertical power supply lines into standard cell structures. Vertical power supply lines such as $V_{DD}$, $V_{SS}$, or ground can be aligned perpendicular to the fins rather than in parallel which can further reduce cell heights.

Novel layout and placement/routing methods described in this disclosure also include pin connections for providing power supply to standard cell structures to further improve device density. Pin connections can be interlayer interconnect vias that provide power supplies to a particular standard cell structure and can be used alone or in combination with power supply lines. By replacing some or all of the power supply lines with pin connections, the number of power supply lines can be reduced. Further, pin connections from adjacent standard cell structures that are connected to a common power or signal source can be placed close to each other by selecting specific locations of pin connections within each standard cell structure or flipping/rotating standard cell layouts. Placing pin connections close to each other can provide the benefits of having shortened metal connection.

Further, embodiments of the disclosed standard cell structure and placement/routing methods can be used in the fabrication of devices at various process technology nodes, such as 5 nm and 3 nm fabrication processes and beyond.

FIG. 1 is an illustration of an exemplary cell layout view that incorporate one-fin standard cell layout designs and two-fin standard cell layout designs, according to some embodiments. The cell layouts illustrated in this disclosure can be standard cell layout or custom-designed cell layouts, from a library of cells. As shown in FIG. 1, integrated circuit 100 includes a few pre-designed circuit blocks also referred to as standard cells. Integrated circuit 100 can include n-type active region 110*a*-110*c*, p-type active region 120*a*-120*c*, power supply lines 130 and 140, one-fin standard cell 150, and two-fin standard cell 160. In some embodiments, the standard cells can be custom-designed cells. For simplicity and clarity purposes, FIG. 1 only illustrates cell boundaries of the standard cells, and other components of the standard cells are omitted. Integrated circuit 100 can further include any other suitable structures, for example, vias, conductive lines, dielectric layers, any other suitable structures, and are not shown in FIG. 1 for simplicity. A standard cell structure can include one or more standard cells from a standard cell library to perform a predetermined function in the integrated circuit, according to some embodiments. A standard cell can be any or all an AND, OR, XOR, XNOR, NAND, inverter, or other suitable logic device. Integrated circuit 100 can include n-type active regions and p-type active regions for forming one or more transistors. For example, n-type active regions 110*a*-110*c* and p-type active regions 120*a*-120*c* are placed parallel with one another and extend in the x-direction, as illustrated in FIG. 1. Power supply lines 130 and 140 are used to provide electrical power supply to the one or more transistors. For example, power line 130 can be a conductive line that provides a supply voltage ($V_{SS}$) and power line 140 can be a conductive line that provides a reference voltage ($V_{DD}$), in accordance with some embodiments. The power supply lines are also placed parallel with the n-type and p-type active regions and extend in the x-direction.

A one-fin standard cell can include a portion of an n-type active region and a portion of a p-type active region to incorporate one n-type finFET and one p-type finFET device. Similarly, a two-fin standard cell can include portions of two n-type regions and portions of two p-type regions to form two n-type finFET devices and two p-type finFET devices. For example, one-fin standard cell 150 can include portions of n-type active region 110*b* and portions of p-type active region 120*b*. Two-fin standard cell 160 can include portions of n-type active regions 110*b* and 110*c* and portions of p-type active regions 120 and 120*b*. The n-type active regions or the p-type active regions can be portions of finFET fins that are doped with n-type or p-type dopants, respectively. A cell boundary is a virtual line that can define cell regions of the standard cells, and the cell regions of neighboring standard cells do not overlap. For example, one-fin standard cell 150 are placed abutting two-fin standard cell 160 while their cell boundaries do not overlap. In some embodiments, upper or lower cell boundaries can be defined between adjacent active regions and on a power supply line. An upper cell boundary of one-fin standard cell 150 as viewed in figures of the present disclosure extends along the X direction and is defined in the middle of a portion of power line 130. As shown in FIG. 1, the X direction is defined as perpendicular to the longer side of two-fin standard cell 160. A lower cell boundary of one-fin standard cell 150 also extends along the X direction and is defined in the middle of a portion of power line 140. In some embodiments, the upper and lower cell boundaries of standard cells can be defined between adjacent active regions but not on a power supply line. For example, an upper cell boundary of two-fin standard cell 160 extends along the X direction and is defined between n-type active region 110a and p-type active region 120a, while a lower cell boundary of two-fin standard cell 160 also extends along the X direction and is defined between n-type active region 110c and p-type active region 120c. The boundary of two-fin standard cell 160 encapsulates portions of power supply lines 130 and 140. In some embodiments, a standard cell can have one of the upper and lower boundaries defined on a power line and the other one defined off a power line. In some embodiments, a standard cell can have both upper and lower boundaries defined on or off the power lines. A standard cell has a cell height along the Y direction. Cell height is defined as a distance between the upper and lower cell boundaries. For example, one-fin standard cell 150 has a cell height $H_1$ and two-fin standard cell 160 has a cell height $H_2$, defined between their respective upper and lower cell boundaries. In some embodiments, a one-fin standard cell includes a portion of an n-type active region and a portion of a p-type active region while a two-fin standard cell can include portions of two n-type regions and portions of two p-type regions, the cell height of a two-fin standard cell can be greater than the cell height of a one-fin standard cell. For example, cell height $H_2$ of two-fin standard cell 160 is greater than cell height $H_1$ of one-fin standard cell 150. In some embodiments, cell height $H_2$ can be about two times the size of cell height $H_1$. In some embodiments, height $H_2$ can be about 1.5 to about 2.5 times the size of cell height $H_1$. A standard cell has a cell width along the X direction, which is defined as a distance between its left and right cell boundaries. In some embodiments, standard cells can have different widths. In some embodiments, standard cells can have similar widths. For example, one-fin standard cell 150 and two-fin standard cell 160 can have similar widths.

Figure 2:
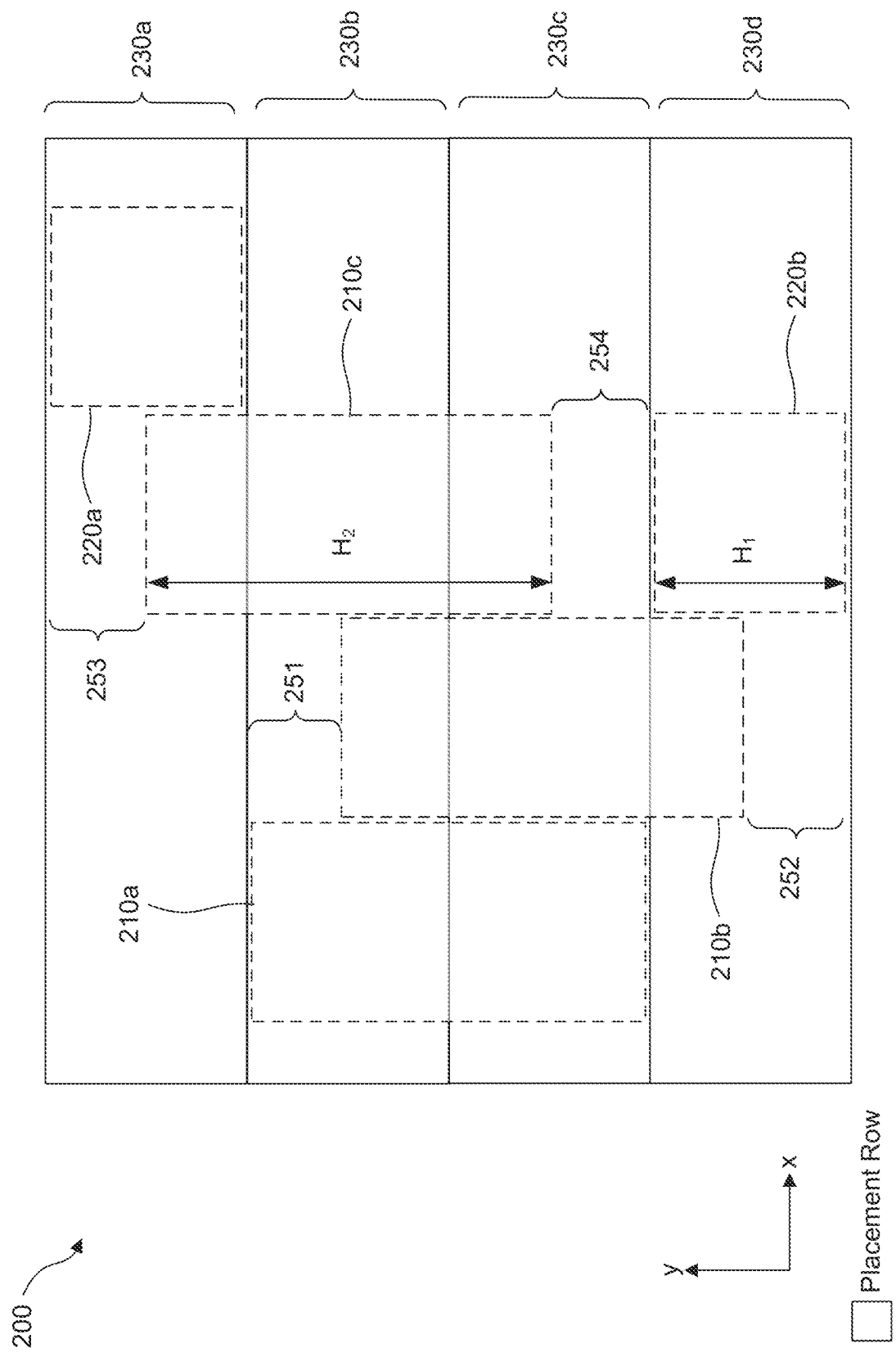
FIGS. 2 and 3 are illustrations of exemplary placement rules associated with one-fin and two-fin standard cell layout designs, according to some embodiments.

FIG. 2 illustrates exemplary rows of cells that are arranged using a horizontal row placement rule, according to some embodiments. The rows of cells illustrated in FIG. 2 can be a portion of integrated circuit 200 that includes at least two-fin standard cells 210a-210c and one-fin standard cells 220a-220b. In some embodiments, the standard cells can be selected from a library of cells. In some embodiments, the standard cells can be custom-designed cells. For simplicity and clarity purposes, FIG. 2 only illustrates cell boundaries of the standard cells, and other components of the standard cells and integrated circuits are omitted. For example, integrated circuit 200 can include power lines, n-type and/or p-type active regions, vias, conductive lines, dielectric layers, any other suitable structures, and are not shown in FIG. 2. Horizontal rows 230a-230d extend in the X direction and are virtual constraints used by an APR process to arrange standard cells in a layout design process. Each horizontal row is placed parallel with and abutting another adjacent horizontal row. A layout design system implementing the APR process can select standard cell designs from the cell library and arrange them in the horizontal rows according to various design rules and check for potential cell-to-cell arrangement violations. In some embodiments, a cell may occupy a single horizontal row. In some embodiments, a cell may occupy more than one horizontal row. The APR process can identify different standard cell layouts such as one-fin standard cells and two-fin standard cells or other cells and arrange them using a horizontal placement rule. For example, the APR process can identify the standard cells by their predetermined functions or by the number of fins included in a standard cell, and move them in the X direction along the horizontal rows according to the placement rules and without violating cell-to-cell arrangement rules.

The horizontal row placement rule presents a number of challenges for cells with different heights because the differences between cell heights can form half-row gaps between their cell boundaries and the adjacent boundaries of the horizontal rows. Half-row gaps creates undesirable empty device space and prevents implementation of compact integrated circuit designs. Half-row gaps can also exacerbate the "ripple effect" where shifting a cell along the horizontal direction can require multiple adjacent cells to relocate. In some embodiments, row heights of the horizontal rows are measured in the Y direction and can be about the same as cell height $H_1$ of a one-fin standard cell. In some embodiments, row heights can be different from cell heights, for example, row heights can be slightly greater or less than cell heights. As shown in in FIG. 2, row heights for horizontal rows 230a-230d are about the same as cell heights of one-fin standard cells 220a-220b. In some embodiments, cell heights of two-fin standard cells 210a-210c can be about two times the cell heights for one-fin standard cells and would therefore occupy more than one horizontal row. For example, two-fin standard cell 210a can occupy two horizontal rows 230b and 230c. A two-fin standard cell can also occupy three horizontal rows and its upper and/or lower cell boundary would be placed in the middle of the horizontal rows, leaving half-row gaps between the cell boundaries and their respective adjacent boundaries of the horizontal rows. Two-fin standard cell 210b and 210c occupy three horizontal rows 230b-230d and 230a-230c, respectively, and half-row gaps 251-254 are formed between their upper/lower cell boundaries and their respective adjacent horizontal rows. Half-row gap 254 formed between two-fin standard cell 210c and one-fin standard cell 220b may not provide sufficient device space for the APR process to place another standard cell, thus creating undesirable wasted device space. In some embodiments, if the APR process is programmed to move two-fin standard cell 210b to the right along the horizontal placement direction (i.e., the X direction), the relocation would also require moving two-fin standard cell 210c and one-fin standard cells 220a-220b, causing the "ripple effect."

Figure 3:
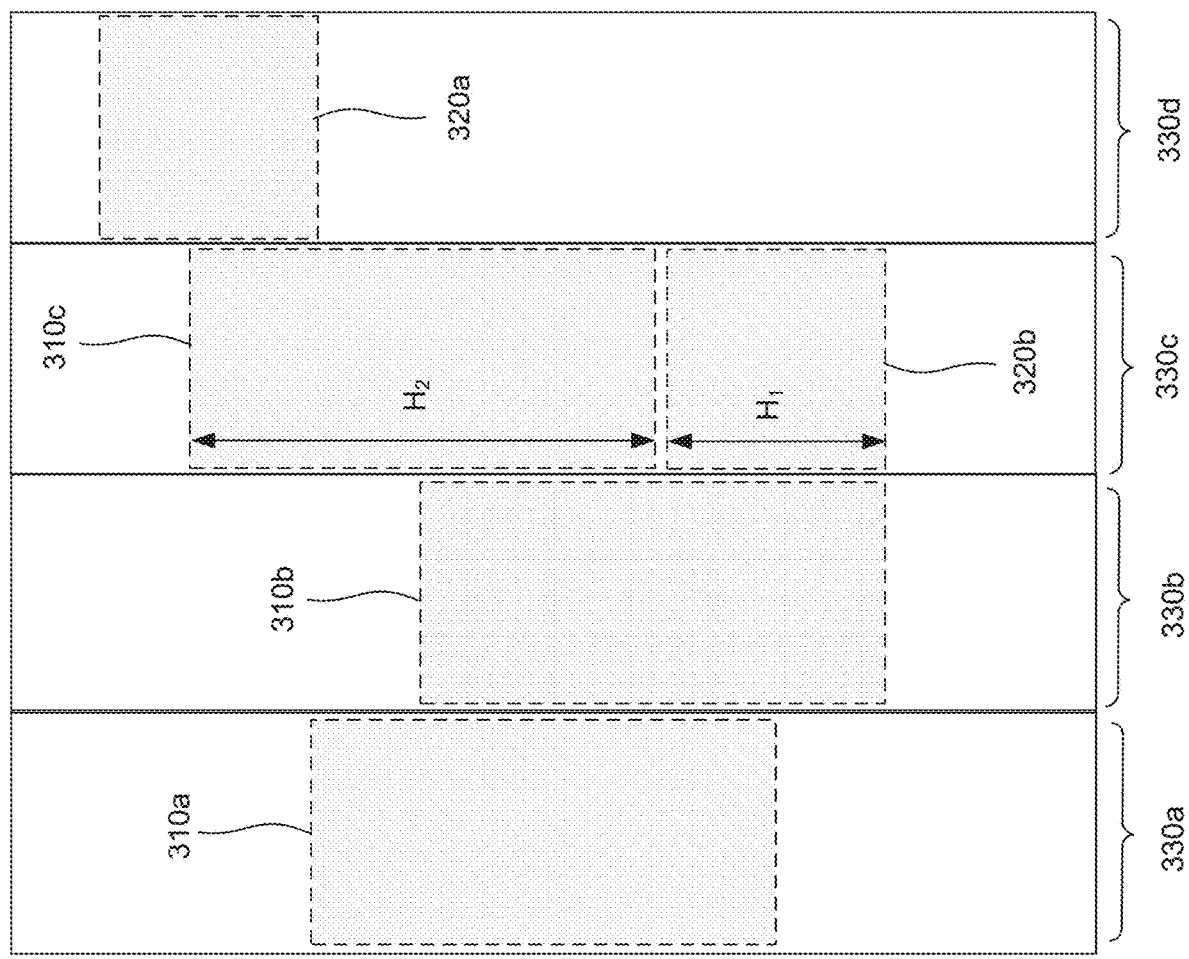

FIG. 3 illustrates exemplary rows of cells that are arranged using a vertical row placement rule, according to some embodiments. Under a vertical row placement rule, a layout design system implementing the APR process can arrange standard cell structures in a vertical direction that is parallel to the cell height (i.e., Y direction). The vertical placement and routing rule enables the APR process to arrange the standard cell structures in a vertical direction based at least on the cell heights of each standard cell structure to reduce or eliminate half-row gaps. For example, a one-fin standard cell structure may have a half-row gap between itself and an adjacent two-fin standard cell structure. The APR process can shift one of the standard cell structures up or down in the vertical direction rather than the horizontal direction such that adjacent standard cells abut each other, and therefore eliminate the half-row gap while preserving functionalities and connections of the standard cell structures.

Rows of cells illustrated in FIG. 3 can be a portion of integrated circuit 300 that includes at least two-fin standard cells 310a-310c and one-fin standard cells 320a-320b. In some embodiments, the standard cells can be selected from a library of cells. In some embodiments, the standard cells can be custom-designed cells. For simplicity and clarity purposes, FIG. 3 only illustrates cell boundaries of the standard cells, and other components of the standard cells and integrated circuits are omitted. Similar to the integrated circuit described above in FIG. 2, integrated circuit 300 can include power lines, n-type and/or p-type active regions, vias, conductive lines, dielectric layers, any other suitable structures, and are not shown in FIG. 3. Vertical rows 330a-330d extend in the Y direction and are virtual constraints used by an APR process to arrange standard cells in a layout design process. Each vertical row is placed parallel with and abutting another adjacent vertical row. A layout design system implementing the vertical row placement process can select standard cell designs from the cell library and arrange them in the vertical rows according to various design rules and check for potential cell-to-cell arrangement violations or design-rule-check (DRC) rules. The APR process can identify different standard cell layouts such as one-fin standard cells and two-fin standard cells or other cells and arrange them using a vertical placement rule to avoid forming gaps between adjacent cells. For example, a layout design system implementing the APR process can identify the standard cells by various categories such as their cell heights, predetermined functions or by the number of fins included in a standard cell, and move them in the Y direction within the vertical rows to eliminate any undesirable empty device spaces without violating cell-to-cell arrangement rules. For example, half-row gap 254 in FIG. 2 that is formed between one-fin standard cell 220b and two-fin standard cell 210c due to different cell heights (e.g., $H_1$ and $H_2$) can be eliminated by shifting either one-fin standard cell 220b or two-fin standard cell 210c or both in the Y direction. One-fin standard cell 220b and two-fin standard cell 210c abut each other in the Y direction after shifting.

Figure 4:
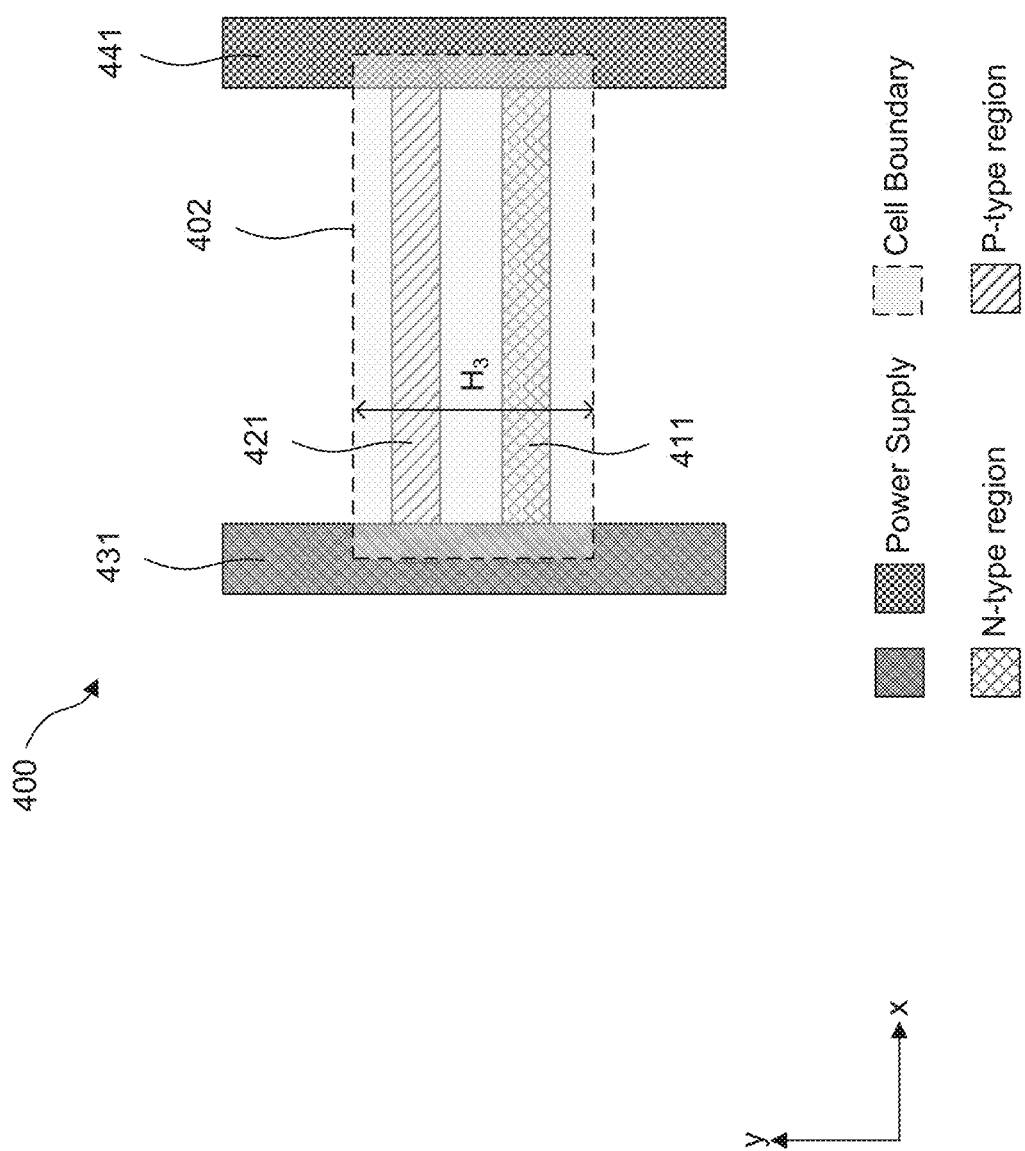
FIG. 4 is an illustration of exemplary layout views of a one-fin standard cell structure optimized by incorporating vertical power supply lines, according to some embodiments.

FIG. 4 illustrates an exemplary cell layout design that implements vertical power supply lines, according to some embodiments. FIG. 4 illustrates integrated circuit 400 which includes a standard cell 402 that incorporates vertical power lines. By replacing horizontal power lines that are parallel with the n-type or p-type active regions with vertical power lines, the cell heights can be reduced and in turn provides the benefits of device density improvement.

Integrated circuit 400 can include n-type active region 411, p-type active region 421, power supply lines 431 and 441 that are perpendicular to the active regions. For simplicity and clarity purposes, FIG. 4 only illustrates cell boundaries of the standard cells, and other components of the standard cells are omitted. Integrated circuit 400 can further include any other suitable structures, for example, vias, conductive lines, dielectric layers, any other suitable structures, and are not shown in FIG. 4 for simplicity. N-type active region 411 and p-type active region 421 can be fins for n-type or p-type finFETs devices. In some embodiments, the standard cells can be custom-designed cells. Similar to power supply lines 130 and 140, power supply lines 431 and 441 are used to provide electrical power supply to the one or more transistors. For example, power line 431 can be $V_{SS}$ supply and power line 441 can be $V_{DD}$ supply, in accordance with some embodiments. Power supply lines 431 and 441 can be electrically connected to n-type active region 411 or p-type active region 421, for example, power supply line 431 can be electrically connected to n-type active region 411 and power supply line 441 can be electrically connected to p-type active region 421. In the cell layout design in FIG. 4, the power supply lines are perpendicular to n-type active region 411 or p-type active region 421. The upper and lower cell boundaries of one-fin standard cell 450 extends along the X direction, however, since power lines are perpendicular to the n-type or p-type active regions, the upper or lower cell boundary no longer needs to be determined by the locations of the power lines. Rather, the upper cell boundary can be defined above the p-type active region 421 by a nominal distance if needed. A nominal distance can be any distance suitable for defining a cell boundary. The nominal distance can depend on the specific cell design; for example, the nominal distance can be defined closer to the p-type or n-type active regions to achieve a smaller cell area. Similarly, the lower cell boundary can be defined below the n-type active region 411 by a nominal distance if needed. Therefore, cell height $H_3$ of one-fin standard cell 450 can be less than cell height $H_1$ of one-fin standard cell 150 as described in FIG. 1 which includes upper and lower cell boundaries defined in the middle of power supply lines.

Figure 5:
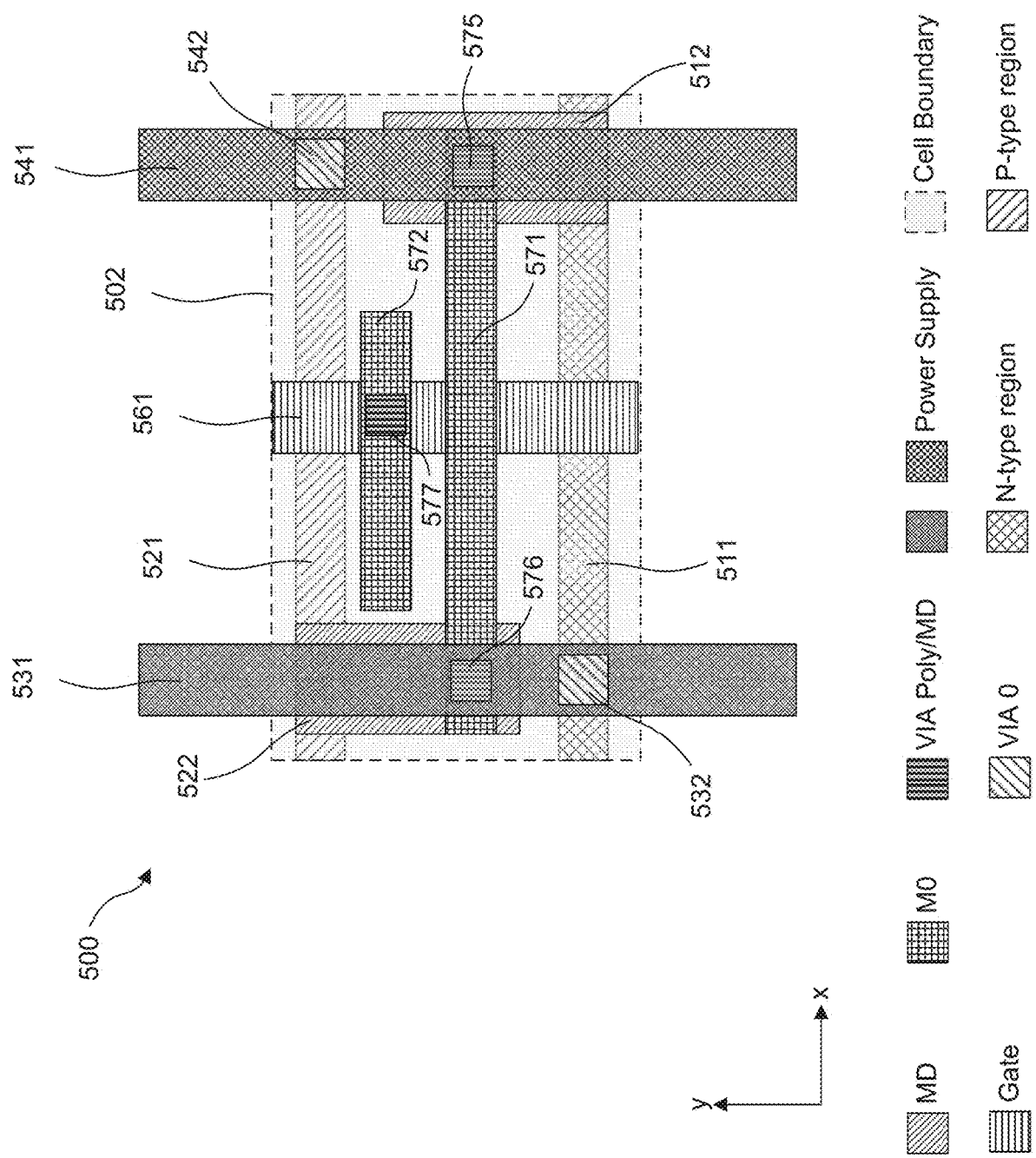
FIG. 5 is a layout view of an exemplary one-fin standard cell inverter design incorporating vertical power supply lines, in accordance to some embodiments.

FIG. 5 illustrates an exemplary inverter cell layout design that implements vertical power supply lines and includes a one-fin standard cell, according to some embodiments. Integrated circuit 500 can include a one-fin standard cell 502. Also shown in FIG. 5 are n-type active region 511, p-type active region 521, metal source/drain (S/D) contacts (labelled as MD in FIG. 5) 512 and 522, power supply lines 531 and 541 that are perpendicular to the active regions, VIA0 structures 532 and 542, gate structure 561, VIA gate/MD structures 575-577, and M0 conductive lines 571 and 572. Integrated circuit 500 can also include other structures such as vias, conductive lines, dielectric layers, any other suitable structures, and are not shown in FIG. 5 for simplicity and clarity purposes. As shown in FIG. 5, vertical power supply lines 531 and 541 are perpendicular to the n-type and p-type active regions, and the upper and lower cell boundaries of one-fin standard cell 502 can extend above or below p-type region or n-type region without the need to depend on the locations of the power supply lines. Rather, in some embodiments, the left and/or right cell boundaries can include portions of the power supply lines as shown in FIG. 5. In some embodiments, the left and/or right cell boundaries overlap the middle of the power supply lines. By replacing horizontal power lines that are parallel with the n-type or p-type active regions with vertical power lines 531 and 541, cell height of one-fin standard cell 502 can be reduced and in turn provides the benefits of device density improvement.

Metal S/D contacts 512 and 522 can provide electrical connection to one or more n-type and/or p-type active regions. M0 conductive lines 571 and 572 can be metal lines in a metal 0 layer of a back-end-of-line (BEOL) interconnect structure. M0 conductive lines can be local interconnects that represent a first interconnect level and electrically connect to an underlying semiconductor device through one or more vias. For example, as shown in FIG. 5, M0 conductive line 571 is connected to metal S/D contacts 512 and 522 through VIA gate/MD structures 575 and 576, respectively. M0 conductive line 572 is connected to gate structure 561 through VIA gate/MD 577. In some embodiments, gate structure 561 can be gate structure of transistor devices such as, for example, fin field-effect transistors (FinFETs), planar transistors, and/or other suitable transistors. Power supply lines can be electrically connected to the n-type or p-type active regions through VIA0 structures. For example, power supply line 531 can be connected to n-type active region 511 through VIA0 532, and power supply line 541 can be connected p-type active region 521 through VIA0 542.

Figure 6:
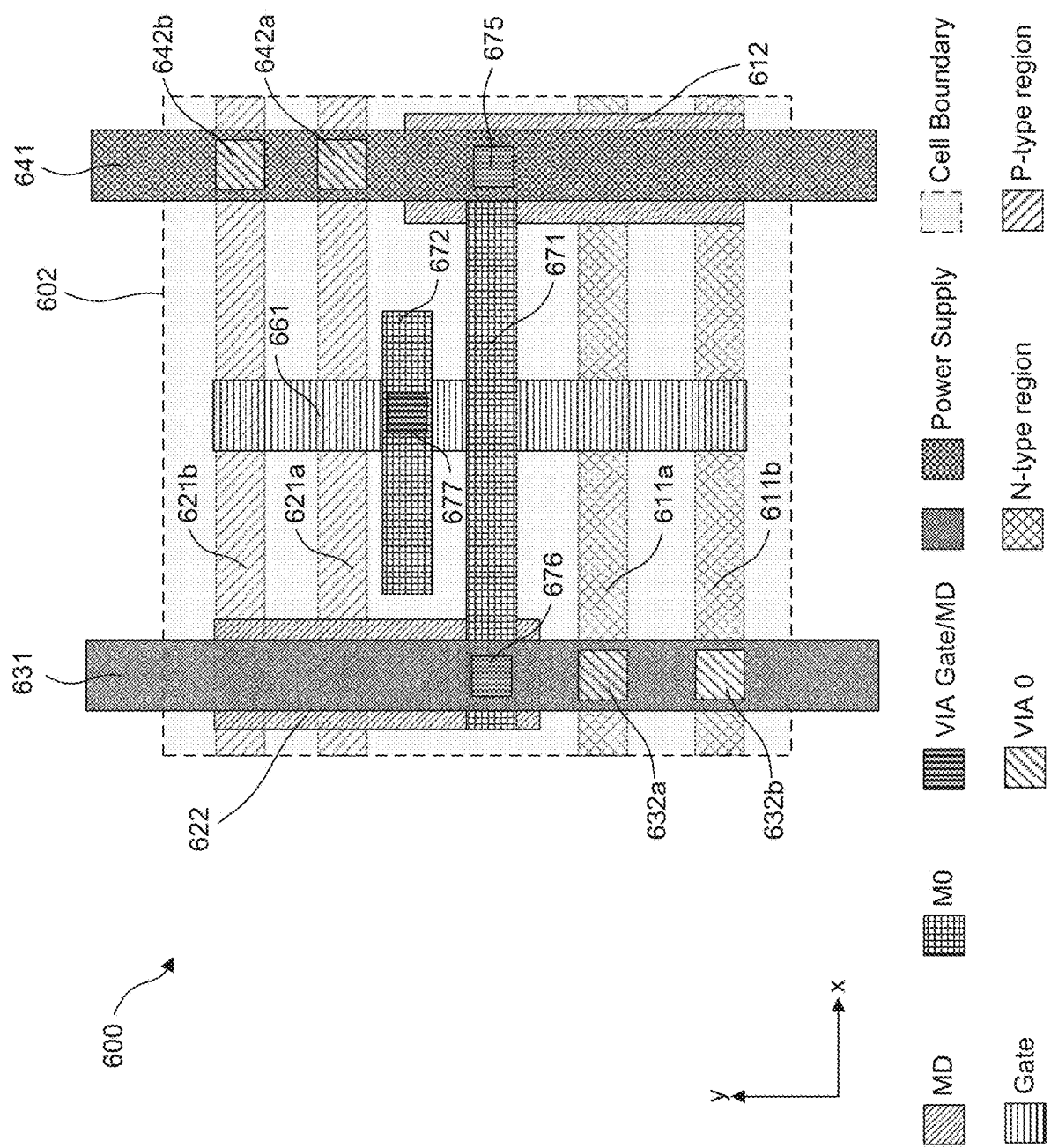
FIG. 6 is a layout view of an exemplary two-fin standard cell inverter design incorporating vertical power supply lines, in accordance to some embodiments.

FIG. 6 illustrates an exemplary inverter cell layout design that implements vertical power supply lines and includes a two-fin standard cell, according to some embodiments. Integrated circuit 600 can include a two-fin standard cell 602. Also shown in FIG. 6 are n-type active regions 611a-611b, p-type active regions 621a-621b, metal S/D contacts 612 and 622, power supply lines 631 and 641 that are perpendicular to the active regions, VIA0 structures 632a-632b and 642a-642b, gate structure 661, VIA gate/MD structures 675-677, M0 conductive lines 671 and 672. In some embodiments, the circuit components and configurations shown in FIG. 6 can be similar to the corresponding circuit components and configurations shown in FIG. 5 and are not described here in detail. In some embodiments, the corresponding circuit components and configurations between FIGS. 5 and 6 can be different, depending on device design and needs. By replacing horizontal power lines that are parallel with the n-type or p-type active regions with vertical power lines 631 and 641, cell height of two-fin standard cell 602 can be reduced and in turn provides the benefits of device density improvement. In some embodiments, the vertical power line configuration can be applied to custom-designed cells or cells in any suitable technology node.

Figure 7:
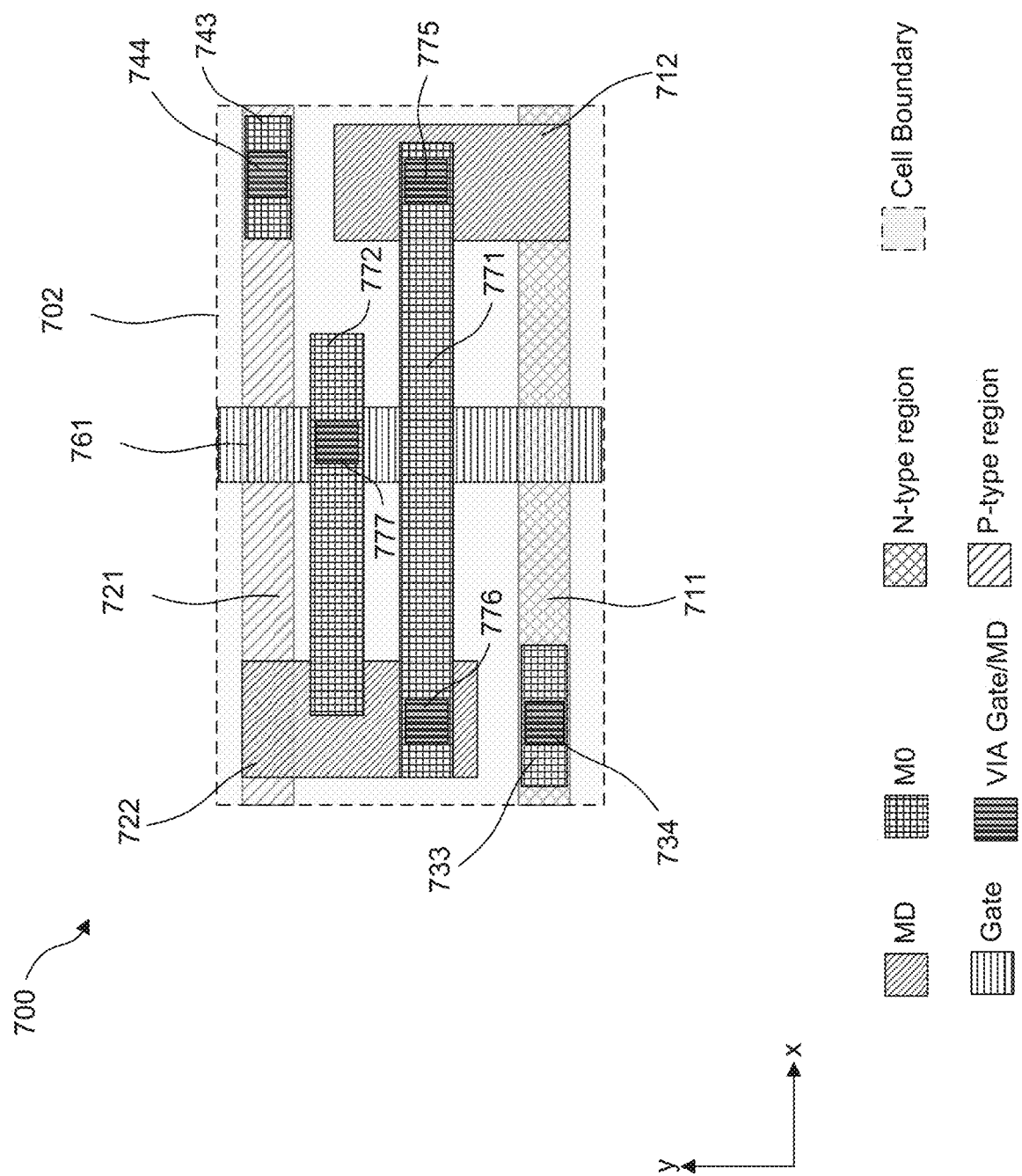
FIG. 7 is a layout view of an exemplary one-fin standard cell inverter design incorporating power supply pins, in accordance to some embodiments.

FIG. 7 illustrates an exemplary cell layout design that implements vertical power supply lines, according to some embodiments. FIG. 7 illustrates integrated circuit 700 which includes a one-fin standard cell 702 that incorporates pin connections for providing power supply to standard cell structures to further improve device density. Pin connections can be interlayer interconnect vias that provide power supplies to a particular standard cell structure and can be used alone or in combination with power supply lines. By replacing some or all of the power supply lines with pin connections, the number of power supply lines can be reduced.

Integrated circuit 700 can include n-type active region 711, p-type active region 721, metal S/D contacts (labelled as MD in FIG. 7) 712 and 722, power supply pins 734 and 744, gate structure 761, VIA gate/MD structures 775-777, and M0 conductive lines 771 and 772. Integrated circuit 700 can also include other structures such as other vias, conductive lines, dielectric layers, any other suitable structures, and are not shown in FIG. 7 for simplicity and clarity purposes. Power supply pins 734 and 744 are used to provide electrical power supply to the one or more transistors. For example, power supply pins can be connected to power supply lines formed in one of the metal layers (e.g., M0, M1, etc.) of a BEOL interconnect structure through one or more vias, in accordance with some embodiments. In some embodiments, power supply pins 734 and 744 can be formed in the same level as the VIA gate/MD in the BEOL interconnect structure. Similar to the cell layout design in FIG. 6, the cell layout design for one-fin standard cell 702 can include upper and/or lower cell boundaries that do not electrically connect to power supply lines. Rather, the upper cell boundary can be defined above the p-type active region 721 by a nominal distance if needed. Similarly, the lower cell boundary can be defined below the n-type active region 711 by a nominal distance if needed. Therefore, cell height of one-fin standard cell 702 can also be less than cell height of one-fin standard cell 150 as described in FIG. 1, which includes upper and lower cell boundaries defined in the middle of power supply lines. Further, by replacing some or all of the power supply lines with pin connections, the number of power supply lines can be reduced to provide more device space for incorporating additional circuit components in standard cells or to provide a more compact standard cell layout design. A layout design tool implementing the APR process can arrange and electrically connect power supply pins to a chip-level power supply plan. In addition, a standard cell incorporating the power supply pin configuration can also be arranged according to the vertical row placement rule during an APR process.

Figure 8:
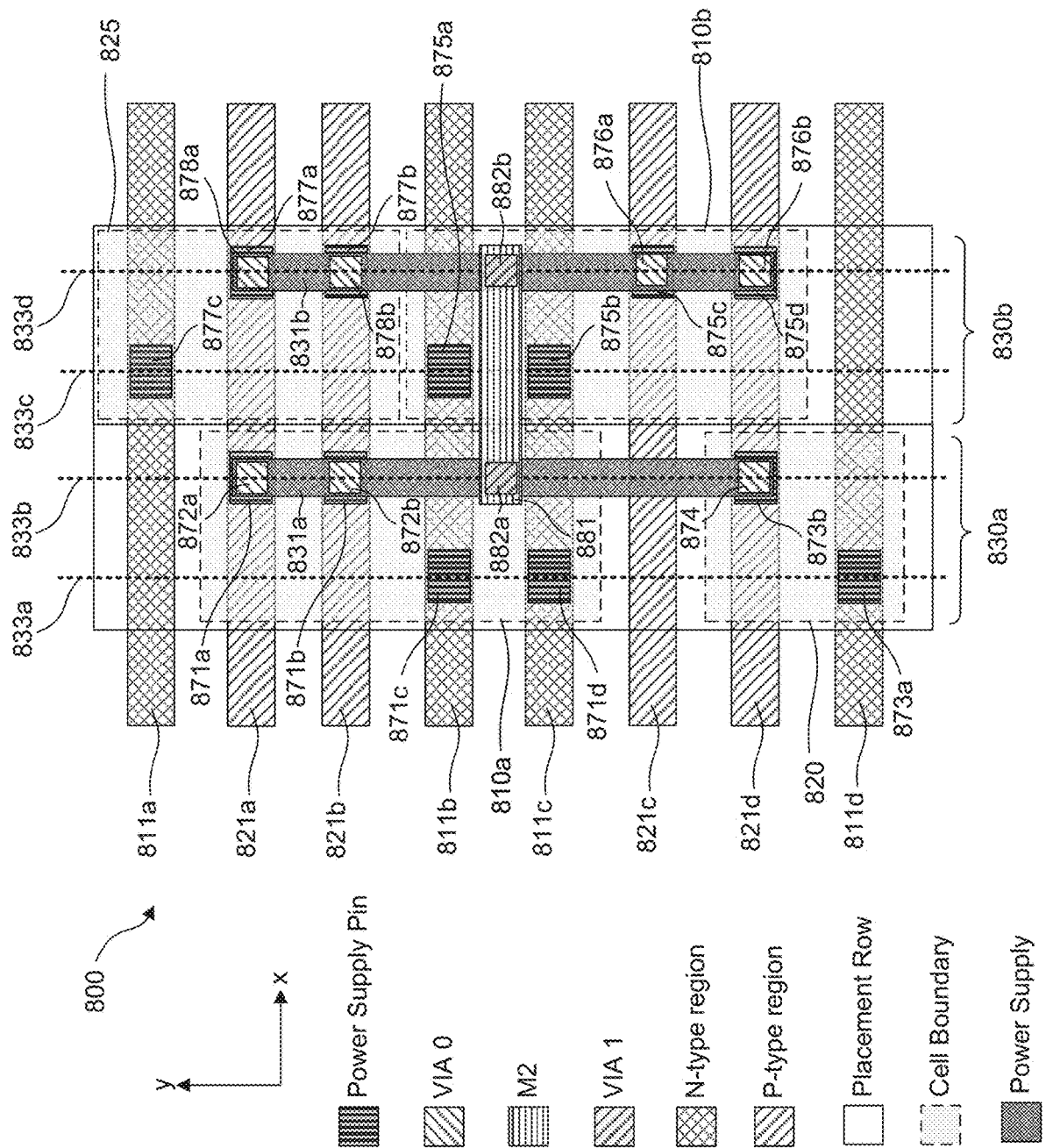
FIG. 8 is a layout view of exemplary standard cell designs incorporating power supply pins, in accordance to some embodiments.

FIG. 8 illustrates exemplary rows of cells that are arranged using a vertical row placement rule and incorporating aligned power supply pins, according to some embodiments. Under a vertical row placement rule, a layout design system implementing the APR process can arrange or move standard cell structures in a vertical direction that is parallel to the cell height to optimize device layout. In addition, the power supply pins can also be aligned during an APR process to provide benefits such as, to name a few, shorter metal connections, more compact device designs, no additional steps in the fabrication process, and more.

FIG. 8 illustrates integrated circuit 800 that includes cells 810a-810b, 820, and 825. Standard cells 810a-810b are two-fin standard cells, standard cell 820 is a one-fin standard cell, while standard cell 825 is a custom-designed cell that includes portions of one n-type active region and two p-type active regions. Also shown in FIG. 8 are n-type active regions 811a-811d, p-type active regions 821a-821d, vertical rows 830a-830b, power supply lines 831a-831b that are perpendicular to the active regions, virtual grid lines 833a-833d, power supply pins 871a-871d, 873a-873b, 875a-875d, 877a-877c, VIA0 872a-872b, 874, 876a-876b, 878a-878b, VIA1 882a-882b, M2 conductive line 881, and VIA1 882a-882b. Circuit components and configurations shown in FIG. 8 that can be similar to the corresponding circuit components and configurations shown in FIG. 7 are not described here in detail. Integrated circuit 800 can also include other structures, such as other vias, conductive lines, dielectric layers, any other suitable structures, and are not shown in FIG. 8 for simplicity and clarity purposes.

In some embodiments, power supply pins 871a-871d, 873a-873b, 875a-875d can be formed on the same level as VIA gate/MD of a BEOL interconnect structure. Power supply lines 831a-831b can be conductive lines that provide $V_{SS}$ or $V_{DD}$ power supply, in accordance with some embodiments. Power supply lines 831a-831b can be connected to power supply pins of standard cells 810a-810b, 820, and 825 through VIA0 structures. In some embodiments, power supply lines 831a-831b can be incorporated in the M1 metal layer of a BEOL interconnect structure. M2 conductive line 881 can be formed above the M1 metal layer and used to connect power supply lines 831a-831b. In some embodiments, M2 conductive line 881 can be a conductive metal line in a metal layer of the BEOL interconnect structure. For example, M2 conductive lines can be local interconnects that represent a third interconnect level—above the first and second interconnect levels—and electrically connects to one or more underlying M1 metal lines through one or more vias. M2 conductive line 881 can electrically connect power supply lines 831a-831b through VIA1 882a-882b.

A layout design system implementing the APR process can identify the power connections of different standard cell layouts and arrange them such that power connections requiring the same power input are aligned on one of the virtual grid lines 833a-833d. In addition, standard cells of the library of cells can be designed such that their power connections are placed in locations that provides convenience when the APR process is operating to align the corresponding power connections. Using the standard cells illustrated in FIG. 8 as an example, power supply pins 871a-871b, 873b, 875c-875d, 877a-877b require the same type of power supply, e.g., power supply lines such as $V_{DD}$, $V_{SS}$, or ground. The APR process can align 871a-871b and 873b on virtual grid line 833b and 875c-875d, 877a-877b on virtual grid line 833d. Because these power supply pins can be aligned in a straight line, power supply lines such as 831a and 831b can also be formed in straight lines which can minimize device footprint and in turn provide the benefits such as shorter metal connections, more compact device designs, and no additional steps in the fabrication.

Figure 9:
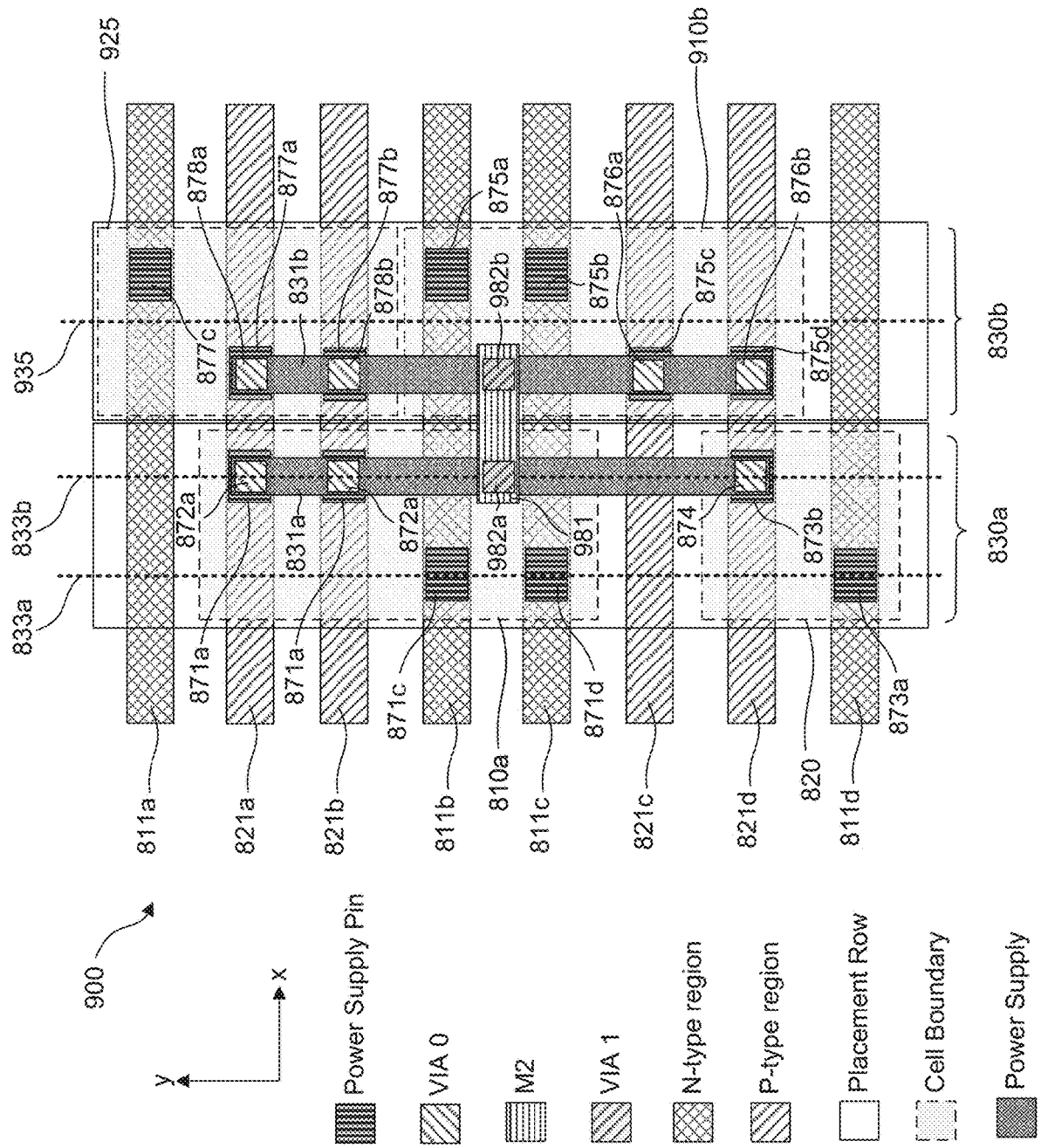
FIG. 9 is a layout view of exemplary standard cell designs incorporating power supply pins and optimized to shorten metal connection, in accordance to some embodiments.

FIG. 9 illustrates exemplary rows of cells that are arranged using a vertical row placement rule and arranged to minimize metal connection lengths to provide a further compact integrated circuit, according to some embodiments.

A layout design system implementing the APR process can identify different standard cell layouts such as one-fin standard cells and two-fin standard cells or other cells and identify their power connection preference and/or requirements. The APR process can be configured to identify characteristics and features of an integrated circuit implementing standard cells, including but not limited to, standard cells functions, dimensions, locations of power connections, and other suitable features. Based on the features and configurations of the standard cells, the layout design system implementing the APR process can rotate standard cells to optimize device layout, in addition to arranging them under vertical or horizontal row placement rules.

In some embodiments, the layout design system implementing the APR process can analyze the integrated circuit 800 described in FIG. 8 and identify the characteristics of the standard cells such as their locations and configurations. For example, the layout design system can identify at least the location, function, connections, locations of the connections, of two-fin standard cells 810a-810b, one-fin standard cell 820, and custom-designed cell 825. The layout design system can optimize the locations and placements of standard cells by arranging or rotating the standard cell layouts to further reduce lengths of metal line connections to further minimize device footprint. For example, by identifying power connections (and/or their locations in the layout design) to standard cells such as power supply pins, power supply lines, and M1 conductive line illustrated in FIG. 8, the layout design system implementing the APR process can rotate standard cells 825 and 810b along a virtual grid line 935 extending along the Y direction (represented by a dotted line in FIG. 9 that marks the axis of symmetry of vertical row 830b or the standard cells placed in vertical row 830b) by 180° to form standard cells 925 and 910b, as shown in FIG. 9. In other words, the standard cells are "flipped." The length of M1 conductive line that is used to electrically connect power supply lines can be reduced because the power supply lines 831a and 831b are placed closer to each other after the standard cell rotation. M1 conductive line 981 which electrically connects power supply lines 831a and 831b through VIA1 982a and 982b can have a length along the X direction that is shorter compared to the length of M1 conductive line 881 illustrated in FIG. 8. In addition, the APR process can place specific components of the standard cells at locations within the standard cells such that routing can be shortened between these specific components. For example, the APR process can align locations of respective power pin connectors 877a and 876a in standard cells 925 and 910b in a straight line, such that power supply line 831b that electrically connect these two power pin connectors is a straight line and without turns, therefore minimizing the length of the power supply line.

Figure 10:
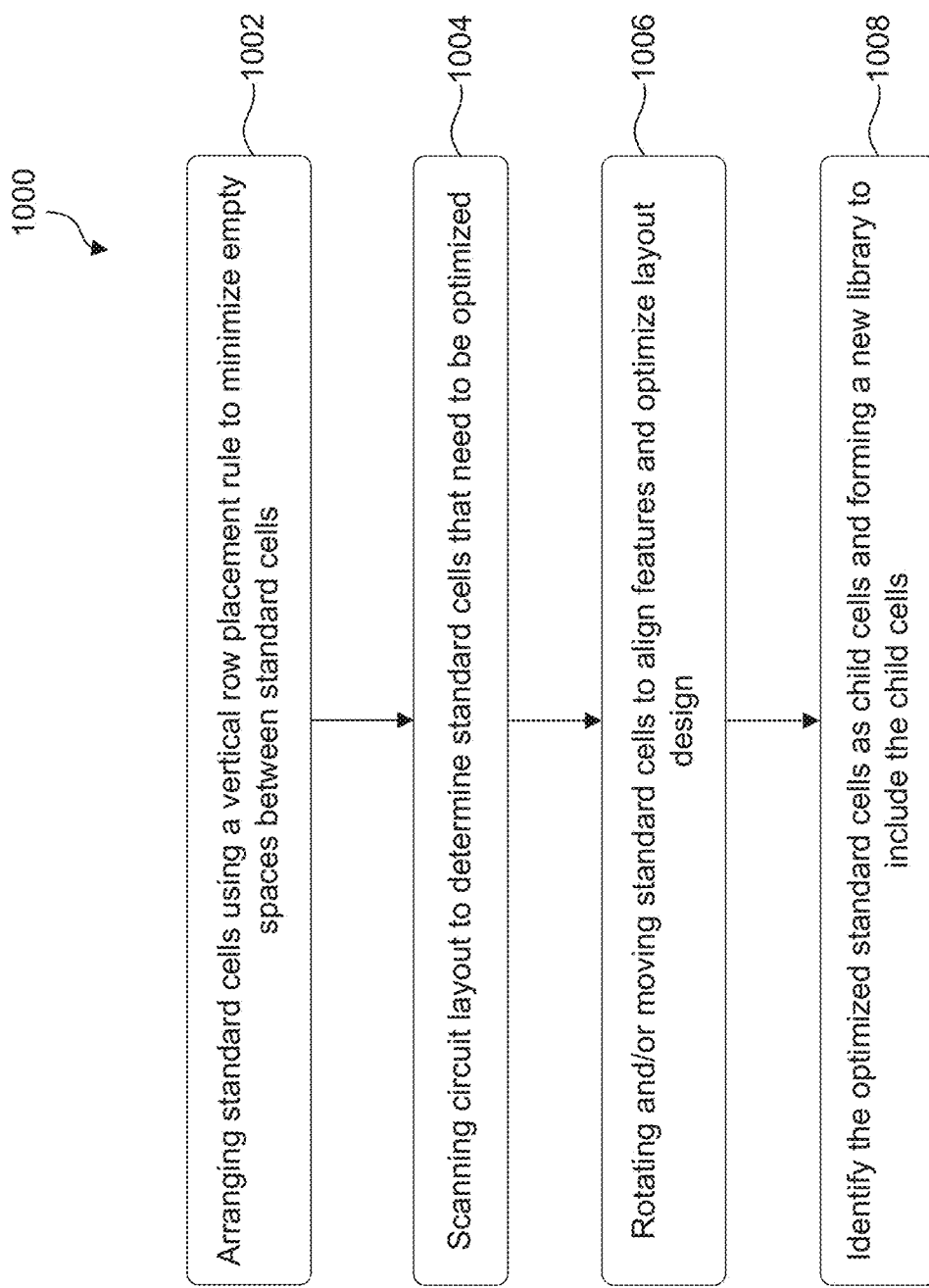
FIG. 10 is an illustration of a method for standard cell placement flow, according to some embodiments.

FIG. 10 is an illustration of a method 1000 for optimizing standard cell layout designs in integrated circuits, according to some embodiments. Operations of method 1000 can also be performed in a different order and/or vary. Variations of method 1000 should also be within the scope of the present disclosure.

At operation 1002, a layout design system that implements the APR process arranges the standard cell structures in a vertical direction based at least on the cell heights of each standard cell structure to reduce or eliminate half-row gaps. For example, a one-fin standard cell structure may have a half-row gap between itself and an adjacent two-fin standard cell structure. The APR process can shift one of the standard cell structures up or down in the vertical direction rather than the horizontal direction to eliminate the half-row gap while preserving functionalities and connections of the standard cell structures.

At operation 1004, a layout design system that implements the APR process scans the circuit layout design to determine standard cells that need to be optimized. In some embodiments, the conductive lines between standard cells are checked, and standard cells with undesirably long conductive lines and/or with undesirable gaps between adjacent standard cells are selected to be optimized. In some embodiments, the standard cells are selected according to certain criteria, e.g., criteria for determining whether a conductive line is too long and/or separation between standard cells is too large. The standard cells can be any custom-designed cells, or any standard cell in the APR database or cell library, e.g., standard cells described above in FIGS. 1-9.

At operation 1006, a layout design system implementing the APR process can identify the power connections of different standard cell layouts and arrange them such that power connections requiring the same power input are aligned. In some embodiments, the power connections are aligned on a virtual grid line that is parallel with the vertical rows for cell placement. Because these power supply pins can be aligned in a straight line, power supply lines can also be formed in straight lines which minimizes device footprint and in turn provide the benefits such as shorter metal connections, less parasitic capacitances, more compact device designs, no additional steps in the fabrication, to name a few. Examples of aligned power supply pins can be power supply pins 871a-871b, 873b, 875c-875d, 877a-877b described above in FIG. 8. In addition, standard cells of the library of cells can be designed such that their power connections are placed in locations that provides convenience when the APR process is operating to align the corresponding power connections. In some embodiments, child cells can be generated when a standard cell is rotated or "flipped" to reduce conductive line lengths.

A layout design system implementing the APR process can also identify different standard cell layouts and identify their power connection preference and/or requirements. Based on the features and configurations of the standard cells, the layout design system implementing the APR process can rotate standard cells to optimize device layout, such as reducing the length of conductive lines, in addition to arranging them under vertical or horizontal row placement rules. Examples of rotated and moved standard cells can be standard cells described above in FIG. 9.

The arrangement of the standard cells is in accordance with design-rule-check (DRC) rules. In some embodiments, before standard cells are placed, it is determined that whether it is possible to rotate or move the selected standard cells without violating the spacing rules and/or DRC rules. In some embodiments, DRC rules includes spacing rules of avoiding cell boundary overlap. In some embodiments, standard cells are arranged to shorten conductive line length. In some embodiments, standard cells are arranged to remove undesirable empty space between adjacent standard cells. The arrangements are consistent with any applicable DRC rules.

At operation 1008, the optimized layout design including one or more standard cells can be identified as child cells or modules and stored in a new cell library. In some embodiments, child cells can be generated by rotating existing standard cells and storing the rotated standard cell in a new library for future use. In some embodiments, a number of optimized standard cells can be stored as child cells.

Figure 11:
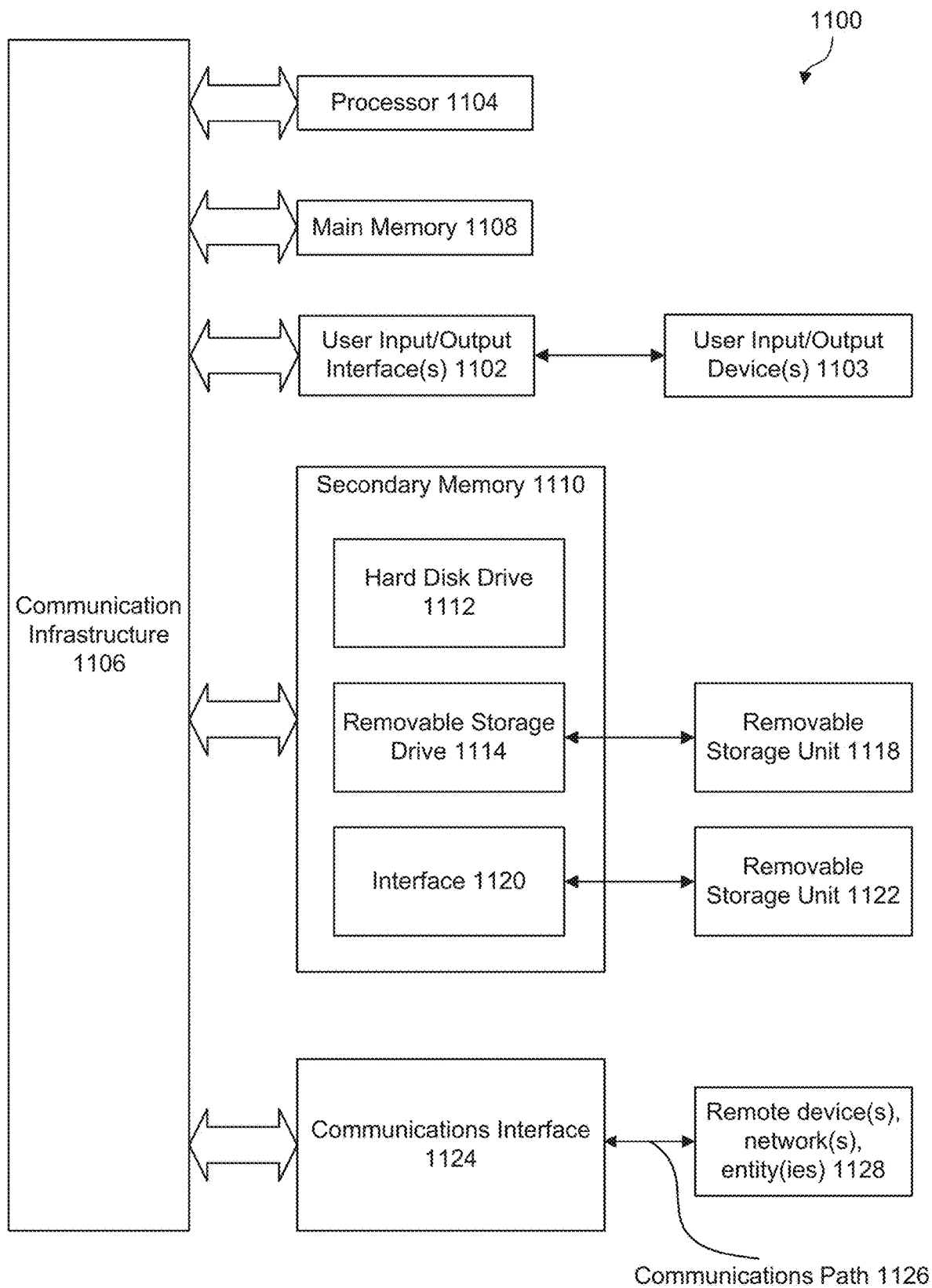
FIG. 11 is an illustration of an exemplary computer system for implementing various embodiments of the present disclosure, according to some embodiments.

FIG. 11 is an illustration of an exemplary computer system 1100 in which various embodiments of the present disclosure can be implemented, according to some embodiments. Computer system 1100 can be any well-known computer capable of performing the functions and operations described herein. For example, and without limitation, computer system 1100 can be capable of selecting standard cells to be optimized and placing metal cuts at desired locations in the standard cells, for example, an EDA tool. Computer system 1100 can be used, for example, to execute one or more operations in method 1000.

Computer system 1100 includes one or more processors (also called central processing units, or CPUs), such as a processor 1104. Processor 1104 is connected to a communication infrastructure or bus 1106. Computer system 1100 also includes input/output device(s) 1103, such as monitors, keyboards, pointing devices, etc., that communicate with communication infrastructure or bus 1106 through input/output interface(s) 1102. An EDA tool can receive instructions to implement functions and operations described herein—e.g., method 1000 of FIG. 10—via input/output device(s) 1103. Computer system 1100 also includes a main or primary memory 1108, such as random access memory (RAM). Main memory 1108 can include one or more levels of cache. Main memory 1108 has stored therein control logic (e.g., computer software) and/or data. In some embodiments, the control logic (e.g., computer software) and/or data can include one or more of the operations described above with respect to method 1000 of FIG. 10.

Computer system 1000 can also include one or more secondary storage devices or memory 1110. Secondary memory 1110 can include, for example, a hard disk drive 1112 and/or a removable storage device or drive 1114. Removable storage drive 1114 can be a floppy disk drive, a magnetic tape drive, a compact disk drive, an optical storage device, tape backup device, and/or any other storage device/drive.

Removable storage drive 1114 can interact with a removable storage unit 1118. Removable storage unit 1118 includes a computer usable or readable storage device having stored thereon computer software (control logic) and/or data. Removable storage unit 1118 can be a floppy disk, magnetic tape, compact disk, DVD, optical storage disk, and/any other computer data storage device. Removable storage drive 1114 reads from and/or writes to removable storage unit 1118.

According to some embodiments, secondary memory 1110 can include other means, instrumentalities or other approaches for allowing computer programs and/or other instructions and/or data to be accessed by computer system 1100. Such means, instrumentalities or other approaches can include, for example, a removable storage unit 1122 and an interface 1120. Examples of the removable storage unit 1122 and the interface 1120 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface. In some embodiments, secondary memory 1110, removable storage unit 1118, and/or removable storage unit 1122 can include one or more of the operations described above with respect to method 1000 of FIG. 10.

Computer system 1100 can further include a communication or network interface 1124. Communication interface 1124 enables computer system 1100 to communicate and interact with any combination of remote devices, remote networks, remote entities, etc. (individually and collectively referenced by reference number 1128). For example, communication interface 1124 can allow computer system 1100 to communicate with remote devices 1128 over communications path 1126, which can be wired and/or wireless, and which can include any combination of LANs, WANs, the Internet, etc. Control logic and/or data can be transmitted to and from computer system 1100 via communication path 1126.

The operations in the preceding embodiments can be implemented in a wide variety of configurations and architectures. Therefore, some or all of the operations in the preceding embodiments—e.g., method 1100 of FIG. 10 and method 1200 of FIG. 12 (described below)—can be performed in hardware, in software or both. In some embodiments, a tangible apparatus or article of manufacture comprising a tangible computer useable or readable medium having control logic (software) stored thereon is also referred to herein as a computer program product or program storage device. This includes, but is not limited to, computer system 1100, main memory 1108, secondary memory 1110 and removable storage units 1118 and 1122, as well as tangible articles of manufacture embodying any combination of the foregoing. Such control logic, when executed by one or more data processing devices (such as computer system 1100), causes such data processing devices to operate as described herein. In some embodiments, computer system 1100 is installed with software to perform operations in the manufacturing of photomasks and circuits, as illustrated in method 1200 of FIG. 12 (described below). In some embodiments, computer system 1100 includes hardware/equipment for the manufacturing of photomasks and circuit fabrication. For example, the hardware/equipment can be connected to or be part of element 1128 (remote device(s), network(s), entity(ies)) of computer system 1100.

Figure 12:
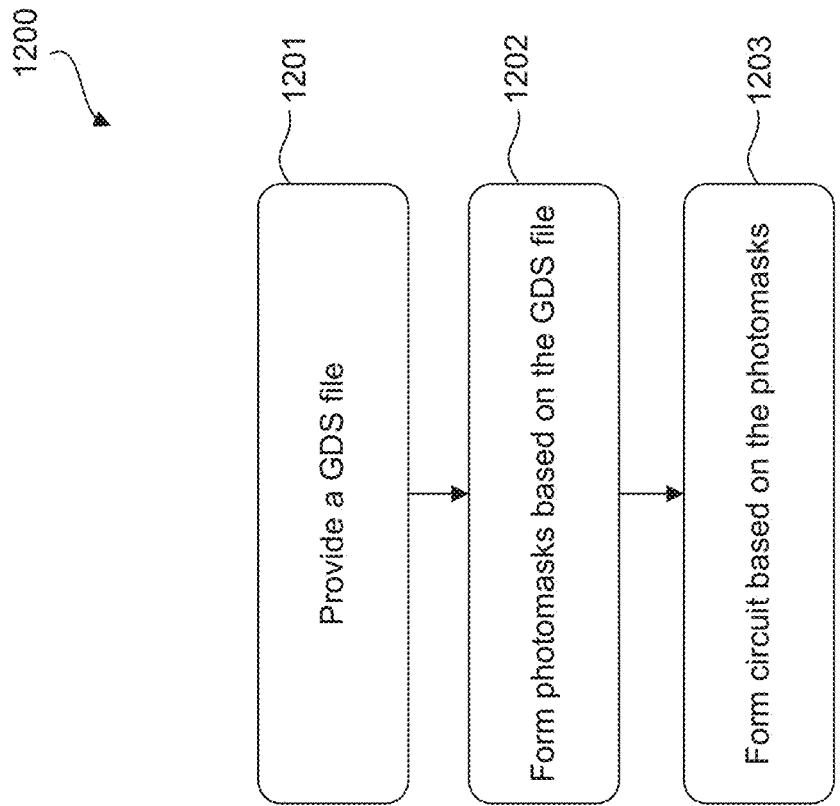
FIG. 12 is an illustration of a process to form standard cell structures based on a graphic database system (GDS) file, according to some embodiments.

FIG. 12 is an illustration of an exemplary method 1200 for circuit fabrication, according to some embodiments. Operations of method 1200 can also be performed in a different order and/or vary. Variations of method 1200 should also be within the scope of the present disclosure.

In operation 1201, a GDS file is provided. The GDS file can be generated by an EDA tool and contain the standard cell structures that have already been optimized using the disclosed method. The operation depicted in 1201 can be performed by, for example, an EDA tool that operates on a computer system, such as computer system 1100 described above.

In operation 1202, photomasks are formed based on the GDS file. In some embodiments, the GDS file provided in operation 1201 is taken to a tape-out operation to generate photomasks for fabricating one or more integrated circuits. In some embodiments, a circuit layout included in the GDS file can be read and transferred onto a quartz or glass substrate to form opaque patterns that correspond to the circuit layout. The opaque patterns can be made of, for example, chromium or other suitable metals. Operation 1202 can be performed by a photomask manufacturer, where the circuit layout is read using a suitable software (e.g., EDA tool) and the circuit layout is transferred onto a substrate using a suitable printing/deposition tool. The photomasks reflect the circuit layout/features included in the GDS file.

In operation 1203, one or more circuits are formed based on the photomasks generated in operation 1202. In some embodiments, the photomasks are used to form patterns/structures of the circuit contained in the GDS file. In some embodiments, various fabrication tools (e.g., photolithography equipment, deposition equipment, and etching equipment) are used to form features of the one or more circuits.

Automatic placement and routing methods described in this disclosure provide placement and routing rules where a system implementing the APR method arranges standard cell structures in a vertical direction that is perpendicular to the fins but parallel to the cell height. The system can shift one of the standard cell structures up or down in the vertical direction rather than the horizontal direction to remove the half-row gap while preserving functionalities and connections of the standard cell structures. Layout methods described in this disclosure also improves device density and further reduces cell height by incorporating vertical power supply lines into standard cell structures. Layout and placement/routing methods described in this disclosure also include pin connections for providing power supply to standard cell structures for further improving device density and performance. Pin connections can be interlayer interconnect vias that provide power supplies to a particular standard cell structure and can be used alone or in combination with power supply lines. By replacing some or all of the power supply lines with pin connections, the number of power supply lines can be reduced. Further, pin connections from adjacent standard cell structures that are connected to a common power or signal source can be aligned and placed close to each other by selecting specific locations of pin connections within each standard cell structure or flipping/rotating standard cell layouts. Placing pin connections close to each other can provide the benefits of having shortened metal connection which in turns provides benefits such as, for example, shorter metal connections, less parasitic capacitances, more compact device designs, no additional steps in the fabrication, to name a few.

In some embodiments, a method of placing and routing standard cell structures include determining first and second directions of a plurality of standard cell structures. The first and second directions are perpendicular to each other. The method also includes determining locations of a plurality of power supply lines and the plurality of power supply lines extend along the second direction and provide electrical supply to the plurality of standard cell structures. The method further includes determining a first height of a first standard cell structure and a second height of a second standard cell structure of the plurality of standard cell structures. The first and second heights are measured in the second direction and are different from each other. The method further includes arranging at least one of the first and second standard cell structures in the second direction.

In some embodiments, a standard cell structure includes a first fin field-effect transistor (finFET) having a first fin that includes a first source/drain contact formed on the first fin. The standard cell structure also includes a second finFET having a second fin. The second fin includes a second source/drain contact formed on the second fin. The first and second fins are parallel with each other. The standard cell structure further includes a first power supply line perpendicular to the first or second fin.

In some embodiments, a method of placing and routing standard cell structures includes determining a first location for a first pin connector of a first standard cell structure. The first standard cell structure includes a first portion of an active region that extends along a direction. The first pin connector is electrically connected to the active region. The method also includes determining a second location for a second pin connector of a second standard cell structure. The second standard cell structure includes a second portion of active region extending along the direction. The second pin connector is electrically connected to the active region. The method further includes determining a third location for a third pin connector of a third standard cell structure such that a power supply line electrically connecting the second and third pin connectors is perpendicular to the direction. The method also includes performing an action on at least one of the first and second standard cell structures along the direction such that a distance between the first and second locations is reduced.

It is to be appreciated that the Detailed Description section, and not the Abstract of the Disclosure, is intended to be used to interpret the claims. The Abstract of the Disclosure section may set forth one or more but not all exemplary embodiments contemplated and thus, are not intended to be limiting to the subjoined claims.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the subjoined claims.

What is claimed is:

1. A method, comprising:
   providing a circuit layout design comprising a plurality of vertical cell regions, wherein each vertical cell region of the plurality of vertical call regions comprises a plurality of standard cells arranged in a vertical direction;
   scanning the circuit layout design to determine a gap between a first standard cell and a second standard cell of a vertical cell region of the plurality of vertical cell regions, wherein the gap has a gap height measured in the vertical direction;
   determining a first location of the first standard cell, wherein a first height of the first standard cell is measured along the vertical direction;

determining a second location of the second standard cell, wherein the second standard cell has a second height measured along the vertical direction; and changing the first location of the first standard cell or the second location of the second standard cell along the vertical direction to reduce the gap.

2. The method of claim 1, wherein the changing comprises abutting the first and second standard cells with each other in the vertical direction.

3. The method of claim 1, wherein the first standard cell comprises a one-fin layout and the second standard cell comprises a two-fin layout.

4. The method of claim 1, wherein the first standard cell comprises a pair of fin field effect transistors (finFETs) and the second standard cell comprises two pairs of finFETs.

5. The method of claim 1, wherein the first height equals to about half of the second height.

6. The method of claim 1, wherein the changing is based on the first and second heights.

7. The method of claim 1, further comprising rotating at least one of the first and second standard cells.

8. The method of claim 7, wherein the rotating comprises rotating at least one of the first and second standard cells around a respective axis of symmetry of the first and second standard cells.

9. The method of claim 1, further comprising determining locations of a plurality of power supply lines, wherein the plurality of power supply lines extend along a horizontal direction perpendicular to the vertical direction and provide an electrical supply to the first and second standard cells.

10. A method, comprising:
scanning a circuit layout design to identify a plurality of vertical cell regions, wherein each vertical cell region of the plurality of vertical cell regions comprises a plurality of standard cell structures arranged in a vertical direction, and wherein each standard cell structure of the plurality of standard cell structures has a height extending in the vertical direction and a width extending in a horizontal direction;

scanning the circuit layout design to determine a gap between a first standard cell structure and a second standard cell structure of a vertical cell region of the plurality of vertical cell regions, wherein the gap has a gap height measured in the vertical direction; and arranging at least one of the first and second standard cell structures in the vertical direction to reduce the gap height.

11. The method of claim 10, further comprising determining the height of each standard cell structure of the plurality of standard cell structures.

12. The method of claim 10, wherein the arranging comprises abutting the first and second standard cell structures with each other.

13. The method of claim 10, further comprising determining locations of a plurality of power supply lines, wherein the plurality of power supply lines extend along the vertical direction and provide an electrical supply to the plurality of standard cell structures.

14. The method of claim 10, wherein the plurality of standard cell structures comprise one or more fin field-effect transistors (finFETs), and the vertical direction is parallel with gate structures of the one or more finFETs.

15. The method of claim 10, further comprising rotating at least one of the first and second standard cell structures.

16. The method of claim 15, wherein the rotating comprises rotating at least one of the first and second standard cell structures around a respective axis of symmetry of the first and second standard cell structures.

17. The method of claim 10, wherein the arranging comprises abutting the first and second standard cell structures with each other in the vertical direction.

18. A method, comprising:
scanning a vertical cell region of a circuit layout design to determine a first plurality of standard cells having a one-fin structure layout and a second plurality of standard cells having a two-fin structure layout, wherein the first and second pluralities of standard cells are arranged in a vertical direction, and wherein each standard cell of the first and second pluralities of standard cells has a cell height extending in the vertical direction;

identifying a gap between a first standard cell from the first plurality of standard cells and a second standard cell from the second plurality of standard cells, wherein the gap has a gap height measured in the vertical direction; and changing a location of the first standard cell or a location of the second standard cell along the vertical direction to reduce the gap height.

19. The method of claim 18, further comprising determining locations of a plurality of power supply lines, wherein the plurality of power supply lines extend along the vertical direction and provide an electrical supply to the first and second pluralities of standard cells.

20. The method of claim 18, wherein the changing comprises abutting the first and second standard cells with each other in the vertical direction.

* * * * *